US 9,401,687 B2

(12) United States Patent
Morriss et al.

(10) Patent No.: US 9,401,687 B2
(45) Date of Patent: Jul. 26, 2016

(54) VOICE ALARM AMPLIFIER

(71) Applicant: Honeywell International Inc., Morristown, NJ (US)

(72) Inventors: Christrohm Robert Shawn Morriss, Nottingham (GB); Sacho Petkov Parvanov, Milton Keynes (GB)

(73) Assignee: HONEYWELL INTERNATIONAL INC., Morristown, NJ (US)

( * ) Notice: Subject to any disclaimer, the term of this patent is extended or adjusted under 35 U.S.C. 154(b) by 543 days.

(21) Appl. No.: 13/859,376

(22) Filed: Apr. 9, 2013

(65) Prior Publication Data
US 2014/0301570 A1 Oct. 9, 2014

(51) Int. Cl.
*H03G 3/30* (2006.01)
*H03F 1/02* (2006.01)
*H03F 1/52* (2006.01)
*H03F 3/183* (2006.01)
*H03F 3/21* (2006.01)
*H03F 3/217* (2006.01)
*H03F 3/68* (2006.01)
*H04R 27/00* (2006.01)
*H04R 29/00* (2006.01)

(52) U.S. Cl.
CPC .......... *H03G 3/3026* (2013.01); *H03F 1/0277* (2013.01); *H03F 1/526* (2013.01); *H03F 3/183* (2013.01); *H03F 3/211* (2013.01); *H03F 3/2173* (2013.01); *H03F 3/68* (2013.01); *H04R 27/00* (2013.01); *H04R 29/007* (2013.01); *H03F 2200/516* (2013.01); *H03F 2200/534* (2013.01); *H04R 2420/03* (2013.01); *H04R 2430/01* (2013.01)

(58) Field of Classification Search
CPC ..... H03G 3/3026; H03F 1/0277; H03F 1/526; H03F 3/183; H03F 3/211; H03F 3/2173; H03F 3/68; H03F 2200/516; H03F 2200/534; H03F 3/72; H04R 27/00; H04R 29/007; H04R 2430/01; H04R 2420/03
USPC .......... 381/82, 84, 85, 55, 58, 107, 120, 123, 381/77, 80, 81; 330/2, 69, 155, 199, 297, 330/207 A, 251, 254; 340/691.4, 517, 506, 340/507, 531
See application file for complete search history.

(56) References Cited

U.S. PATENT DOCUMENTS

| 4,683,591 | A | * | 7/1987 | Dawson et al. ............ 381/85 |
| 4,973,919 | A | | 11/1990 | Allfather |
| 2004/0176955 | A1 | | 9/2004 | Farinelli, Jr. et al. |
| 2009/0219090 | A1 | | 9/2009 | Wong et al. |
| 2013/0259266 | A1 | * | 10/2013 | Yayama et al. ............ 381/120 |

OTHER PUBLICATIONS

Examination Report for corresponding EP application 14 161 345.5, dated Jul. 3, 2014.
Search Report for corresponding EP application 14 161 345.5, dated Jun. 24, 2014.

* cited by examiner

*Primary Examiner* — David Ton
(74) *Attorney, Agent, or Firm* — Husch Blackwell LLP

(57) ABSTRACT

An emergency message output amplifier includes a plurality of audio output channels. Channels can be combined together to increase output power, and can be isolated from respective output speakers in response to detected faults and then disabled. The functional amplifier can be activated by itself and output current can be monitored to lower the output level enough to enable the amplifier to properly drive the existing load.

18 Claims, 18 Drawing Sheets

VOICE ALARM AMPLIFIER

FIELD

The application pertains to amplifiers and methods of operating amplifiers associated with monitoring or alarm systems installed in regions of interest. More particularly, the application pertains to such amplifiers and methods which maintain intelligibility and integrity of life-safety voice messages in adverse operating conditions.

BACKGROUND

Voice alarm amplifiers can be found in regional monitoring, or fire alarm systems. They provide audible, or verbal, outputs to individuals in the region being monitored in response to detected alarm conditions.

Given the stressful or chaotic conditions that can be present in a fire or other type of alarm condition, intelligibility and integrity of life-safety messages is very important. It is also important to identify internal amplifier faults and external wiring faults by continuous monitoring and self-test. Additionally, it can be important to be able to respond to faults that occur during an emergency, such as amplifier channel faults, due to partial earth faults or over-loading faults. At times, inadequate power per channel may produce conditions that impair the intelligibility and integrity of life-safety messages.

Another known problem relates to the deleterious effect of control signals on the intelligibility and integrity of output audio. High voltage (100V or 70V) voice alarm systems sometimes use very low frequency waveforms to measure the impedance of the load, so that loudspeaker faults or the disconnection of one or more speakers on the output may be discovered by the change to the expected load impedance. These low frequency signals are known to cause intermodulation distortion in the output transformer, which may decrease the intelligibility of the wanted voice messages.

DETAILED DESCRIPTION

Figure 1:
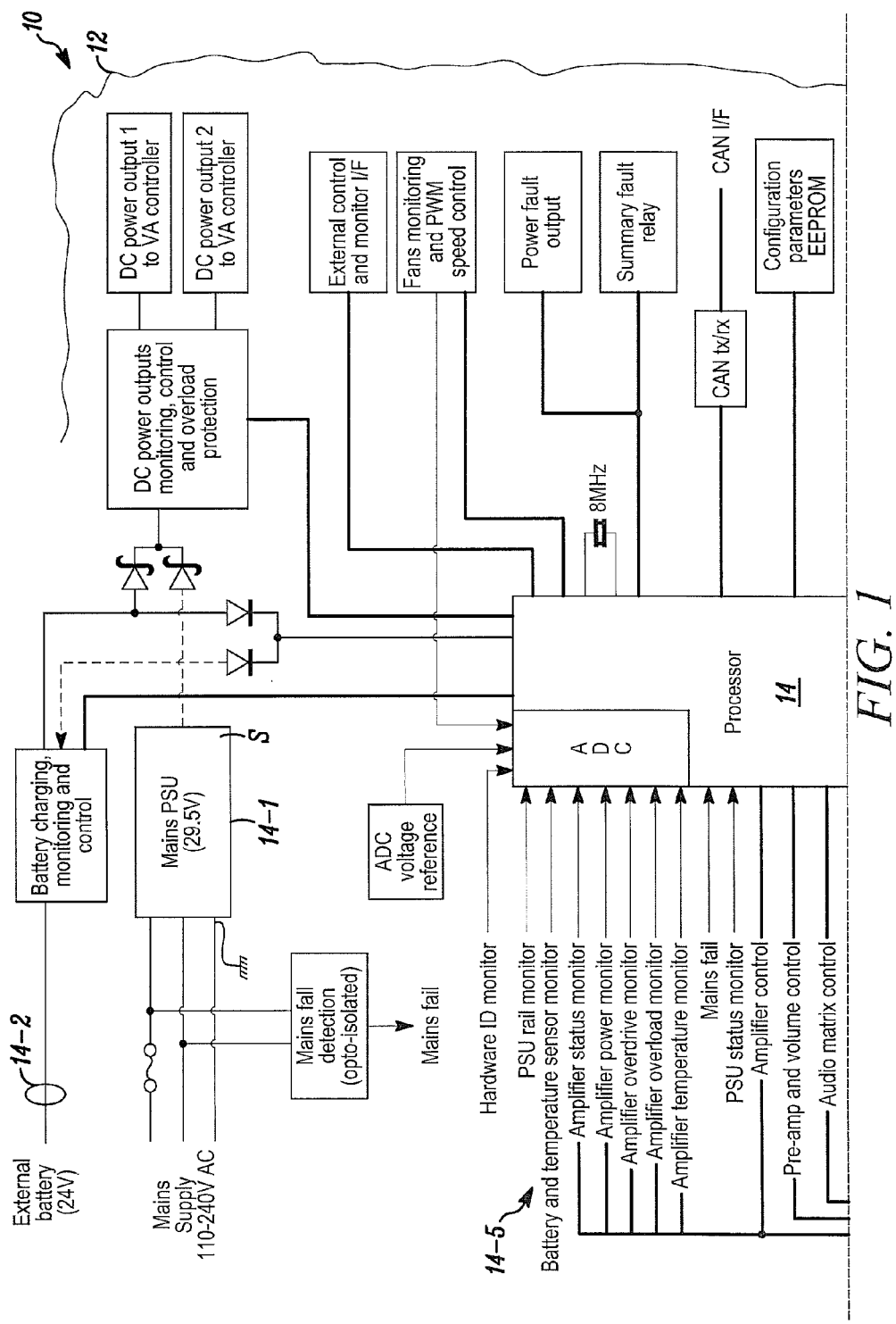
FIG. 1 illustrates a block diagram of an embodiment of an amplifier in accordance herewith.
Figure 1:
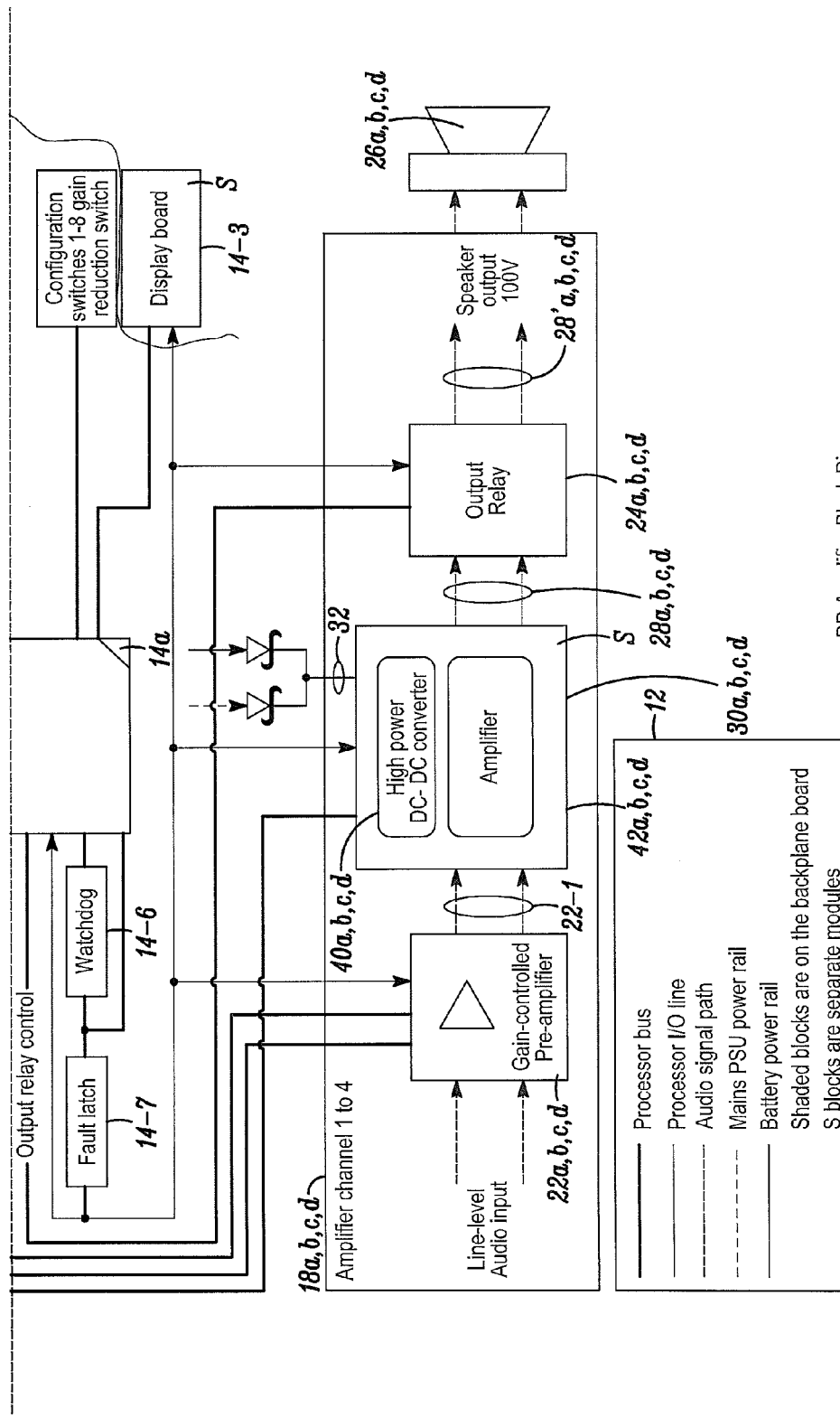

While disclosed embodiments can take many different forms, specific embodiments thereof are shown in the drawings and will be described herein in detail with the understanding that the present disclosure is to be considered as an exemplification of the principles thereof as well as the best mode of practicing same, and is not intended to limit the application or claims to the specific embodiment illustrated.

In disclosed embodiments, separate audio output channels, implemented with substantially identical modular components, can maintain intelligibility of voice alarm evacuation messages including automatically managing faults on a per channel basis.

In one aspect hereof, multiple amplifier channels employing the above-described functionality operate independently of each other such that a fault in one amplifier channel will not affect the operation of the remaining channels. Furthermore, the amplifier channels can be configured in parallel to increase the power output of the combined channel. If subsequently a fault is developed in any channel, its output will be automatically isolated thus maintaining normal operation of the other paralleled channel.

The above described configuration preserves the overall integrity of the voice alarm amplifier by providing inherent redundancy. Additionally, the isolation between amplifier channels ensures that any type of damage to the loudspeaker line connected to a channel, or any internal component failure on that amplifier channel, is confined to that channel only and does not have any impact on the performance of the other channels.

In yet another aspect, voice alarm amplifiers in accordance herewith, do not require output transformers to drive the 100V or 70V loudspeaker lines, removing a cause of distortion. Furthermore, full galvanic isolation is provided between the output channels in the manner expected of a conventional transformer-coupled design. This isolation between channels ensures that an earth fault on any of the high voltage loudspeaker lines may be detected and identified as being present on a particular output channel without having any impact on any aspect of the performance of the other channels.

To maintain verbal output integrity, automatic volume control processing operates independently on each amplifier channel in case of speaker output loading exceeding the rated limit (over-load). The output loading is continuously tracked and the volume is reduced in pre-defined steps when over-loading is detected. Similarly, when over-loading is no longer detected, the volume is increased in pre-defined steps. Practical situations could be the partial or full short-circuit of a speaker line due to moisture in the cable, a fire event, installation errors or impedance surveillance signals. Known products in the same market, unlike the disclosed embodiments herein, employ techniques of disconnection of the amplifier output from the speakers until the fault is removed. Unlike embodiments hereof, in those prior art products, the voice alarm messages often cannot be heard.

To minimize output degradation, automatic volume control processing, operating independently on each amplifier channel can be provided to address situations where audio input signal levels exceed the rated limit (over-drive). Practical situations include excessive microphone levels at call stations such as fireman microphones, live PA speech or live DJ announcements. Unlike the disclosed embodiments, known products on the market utilize level-limiters where the audio quality could be degraded.

Disclosed amplifier modules can continue their operation in the presence of simultaneously present different fault conditions on amplifier channels without significant degradation of audio quality. Practical situations could be different types of partial earth faults or over-loading faults present simultaneously on different amplifier channels where they continue to operate as expected.

Two or more amplifier channels can be coupled in parallel to provide inherent redundancy. In this mode the two channels normally drive the load up to the combined power of the two channels. In the event of a failure of one amplifier channel, the independent channel fault monitoring isolates that channel from the load and shuts it down, leaving a single channel driving the higher power load. If this channel is incapable of driving the load on its own to the required power level, the process described above automatically reduces the power to a level at which an undistorted output may be maintained. The process functions continuously to restore normal power operation on lower level signals to ensure the highest level of intelligibility of voice evacuation messages.

Per channel, locally isolated power supplies provide a seamless transition from mains to battery power and back in the event of interruptions in the mains power supply. Together with the galvanic isolation of the audio input signal to each amplifier module, this enables the amplifier to drive up to 100V rms of audio onto the speaker lines in a fully floating manner, emulating a conventional transformer-coupled output.

FIG. 1 illustrates a block diagram of an embodiment 10 hereof. Amplifier 10 can be implemented in part using a backplane, PC board, generally indicated at 12.

In FIG. 1, shaded elements or blocks are carried on the backplane 12. Other blocks, labelled "S" are implemented as separate modules or on separate printed circuit boards. The modules, such as the amplifier modules could be couplable to the backplane 12 using connectors for ease of installation and maintenance.

Common system services are provided via the blackplane board 12 including input/output connectors for user interfaces. Programmable processor 14 is coupled to a variety of elements including a plurality of channel amplifiers, such as amplifiers 18 *a, b, c, d*. It will be understood that fewer or more amplifier channels can be provided without departing from the spirit and scope hereof.

Additional elements include gain-controlled pre-amplifier circuits, on a per channel basis, 22 *a, b, c, d* and output relays 24 *a, b, c, d* to provide isolation, for example in response to faults, at respective speakers, 26 *a, b, c, d*, on a per channel basis.

There are separate amplifier PCBs for each channel 30 *a, b, c, d* to provide low crosstalk between channels and simple, plug-in, replacement of a faulty module. Each amplifier unit is self-contained with its own integral heat sinks and removably plugs into the backplane board 12. The 100V output connection from each module to the output relays, such as 24 *a, b, c, d* on the backplane 12 has its own 2-pin socket. The amplifier boards such as 30 *a, b, c, d* have individual power feeds for both the mains PSU 14-1 and an external battery supply 14-2 as indicated at 32. The amplifier outputs, on a per channel basis, 28 *a, b, c, d* are coupled to respective speakers 26 *a, b, c, d* without any need for intervening transformers.

The display board 14-3 mounted on a front panel provides visual indication of the amplifier status to the user. Surface-mount LEDs on the rear of the board emit light through holes in the board 14-3, with plastic light pipes guiding the light to the apertures in the front panel. There is no active circuitry on this board, with the drive hardware located on the backplane 12.

Control software 14*a*, executed by processor 14 can include some or all of the following control features:

Fault monitoring and control of four identical Class-D direct-drive high power amplifiers, such as 42, *a, b, c, d* capable of driving industry standard 100V or 70V speakers, such as 28 *a, b, c, d* on a per channel basis.

Individual amplifier channel digital volume (gain) control via processor controllable digital potentiometers or other suitable method.

Individual amplifier channel output speaker relay control used to isolate the amplifier output from the speaker output in case of amplifier fault.

Audio input signals routing control for amplifier channels' individual or parallel modes of operation.

Monitoring of hardware ID of various amplifier modules at initialization after reset used to determine the hardware variant and related functionality during run-time.

Monitoring and control of mains PSU.

Monitoring and control of integrated battery charger designed for compliance to life-safety standards.

Monitoring of battery temperature sensor.

Monitoring and control of two DC power outputs used for power feed to VA controller and peripherals.

Variable speed control of cooling fans dependent on the temperature and internal status of various amplifier modules.

Monitoring and priority execution of external signals for amplifier channels' enable/disable control.

Control of visual indication to present the system status to the user/operator.

Monitoring of external reset fault signals.

Monitoring of bank of gain control switches and configuration switches for software controlled options.

Continuous integrity monitoring for watchdog circuit activation (system fault), internal flash and configuration parameters stored in external non-volatile memory, for example EEPROM.

Control of summary fault relay and logic-level power faults output.

High speed reliable communication over CAN bus using DeviceNet protocol for full system status reporting, control, test and debug purposes.

Control of production and diagnostics parameters in non-volatile memory, for example EEPROM, via synchronous serial interface.

In-circuit programming of the processor 14 using a dedicated serial programming interface coupled to a flash-type memory programmer.

Various of the above noted inputs can be provided as analog signals which can be sampled by an ADC of processor 14. The processor 14 can respond to a variety of monitoring or control inputs, indicated generally at 14-5 as would be understood by those of skill in the art. A watchdog timer 14-6 and a fault latch 14-7 are available to address faults that might be detected.

When programs are running normally, the software calls a low-level watchdog function at a regular interval to prevent the watchdog circuit 14-6 from timing out. The function toggles the control line frequently, for example every few milliseconds. The function watchdog is invoked from the main loop, as in FIG. 3, and not from an interrupt service routine (ISR) in order to ensure that the whole program is executed properly. Hence, any deadlock or program execution failure will result in activation of the watchdog circuit.

Various software modules, as at 14*a*, executed by processor 14 in the embodiment of FIG. 1 can include:

1. Amplifier Controller—this module is responsible for making decisions independently (per amplifier) for each amplifier control management, amplifier setup, and amplifier gain (volume) control.
2. Audio Matrix—this module initializes the amplifier unit output power configuration based on the configuration switches selected option. It reads the amplifier hardware configuration variant and validates the amplifier hardware status based on populated amplifier modules.

3. Amplifier—this module determines the various faults for each amplifier and provides services for enable/disable control.
4. Battery Charger—this module is responsible for making decisions about the battery charger voltage, current and load test. It also provides services for battery charger control.
5. CRC32—this module performs the mathematical calculations for a CRC32 algorithm which is used for flash memory integrity verification.
6. Display—this module is responsible for updating the LEDs' visual indication based on full amplifier unit system status.
7. Event Log—this module provides services for event logging.
8. Fan—this module determines the fan 1, 2 & 3 fault states.
9. Temperature Sensor—this module processes temperature sensor A/D voltage to internal software values for control of the following services:
   Variable fan speed.
   Battery charger temperature-compensated charging voltage.
   Remaining battery life calculation.
   Print of debug information regarding measurements of amplifier modules and battery temperature.
10. Power Supply—this module is responsible for monitoring and status update of the following:
    PSU power supply rail.
    Internal PSU summary status.
    Standby battery supply rail.
    Amplifier 1, 2, 3 & 4 power rail.
    External DC Power Output 1 & 2.
11. Volume Control—this module provides a set of functions to control the dual digital potentiometers for volume (gain) control of amplifier channels 18 *a, b, c, d*.

Figure 2A:
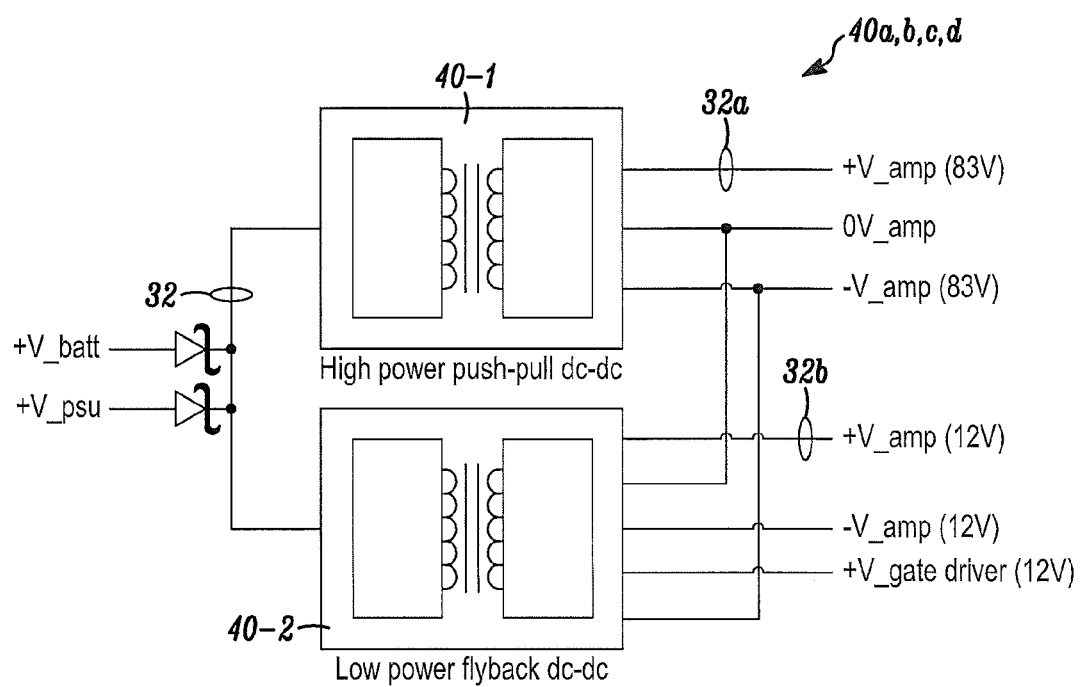
FIG. 2A illustrates a block diagram of a channel power supply.

The amplifier modules, such as 30 *a, b, c, d* include respective power DC-DC converter circuitry, such as 40 *a, b, c, d*. These power supplies, as illustrated in FIG. 2A, each include two isolated DC-DC convertors, 40-1 and 40-2. One provides the low voltage, low power outputs required by the amplifier section; the other provides the high voltage, high power outputs. Other embodiments using one isolated DC-DC converter are possible.

The DC outputs of these converters supply the power to the full-bridge Class-D amplifier section. The DC-DC converters, such as 40-1, 40-2, on each amplifier board have the two main DC input sources, from the PSU 14-1 and the battery, diode-OR-ed, as at 32, so that the power will be taken from the rail at the highest voltage. The output voltage of the PSU 14-1 can be set to 29.5V+/−0.15V, so is always higher than the battery voltage 14-2. Each DC-DC converter must therefore be able to provide the full output power over the input voltage range from the minimum specified battery voltage of 20.5V to the maximum PSU output voltage of 29.65V.

The low power supply 40-2 is a flyback type, with transformer isolation between input and outputs. Optically coupled feedback taken from 32 *b* sets the output voltage with the output being sensed on a floating 12V output.

This supply provides three direct outputs, with two additional outputs provided through fixed linear regulators.

The high power DC-DC converter 40-1 is a push-pull type, using a center-tapped output transformer to provide the input-output isolation. Opto-coupler feedback is used to set the output voltage in a similar manner to the low-power converter 40-2. Feedback is taken from the +V output 32 *a*. The switching frequency is nominally 140 kHz.

Figure 2B:
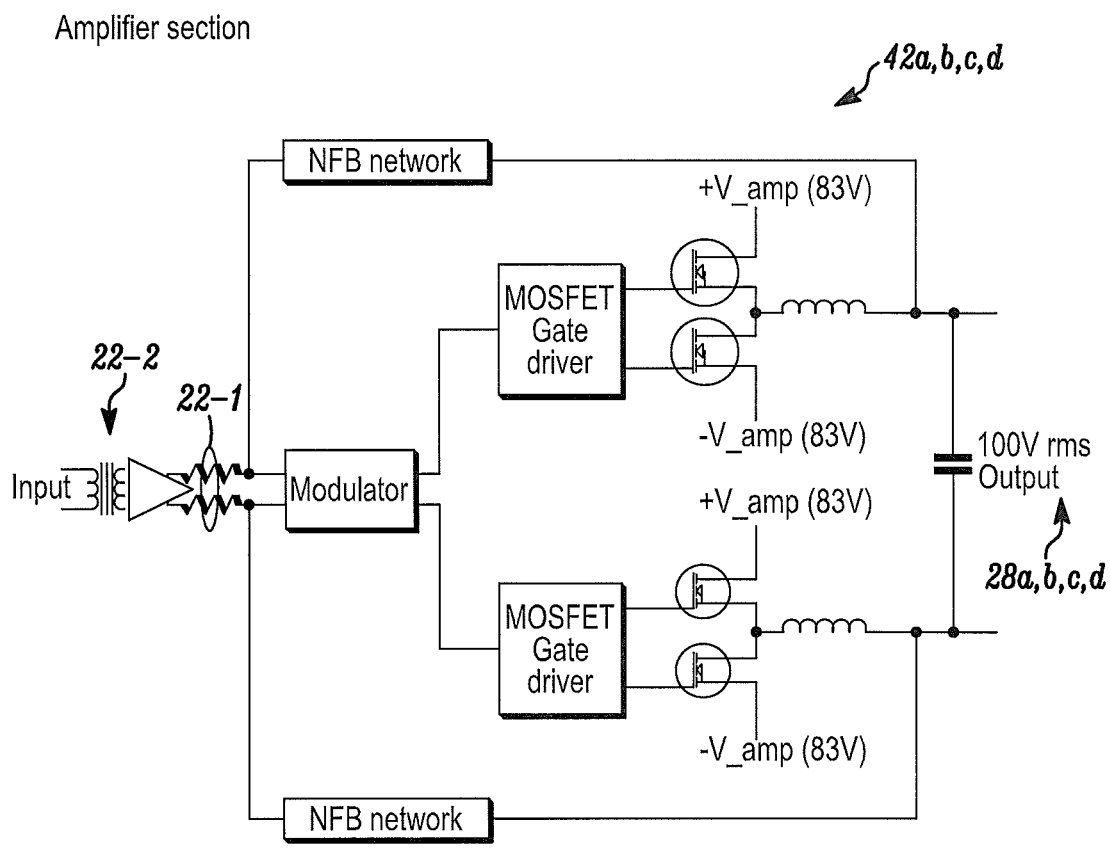
FIG. 2B illustrates a block diagram of a class-D audible amplifier.

With respect to FIG. 2B, the amplifier sections, such as 42 *a, b, c, d* are configured with a fully-balanced design from input to output, and provide a floating 100V rms audio output 28 *a, b, c, d*. Isolation is provided by the input coupling transformer 22-2, together with the isolation in the DC-DC converters 40-1, -2.

The amplifiers 42 *a, b, c, d* may be of a self-oscillating PWM controlled Class-D design, operating with phase-shift or hysteretic control of the oscillation. The amplifiers are inverting at audio frequencies, but the combination of the phase shift of the output stage, combined with the propagation delay of the driver stage, together with any hysteresis in the modulator, modified by suitable frequency and phase compensation networks forming part of the feedback loop set a stable self-oscillation frequency of around 280 kHz at idle. The input audio signal causes this self-oscillation to be PWM modulated. Those of skill will understand that the circuits of FIGS. 2A, 2B are exemplary only and other variations come within the spirit and scope hereof.

Figure 3:
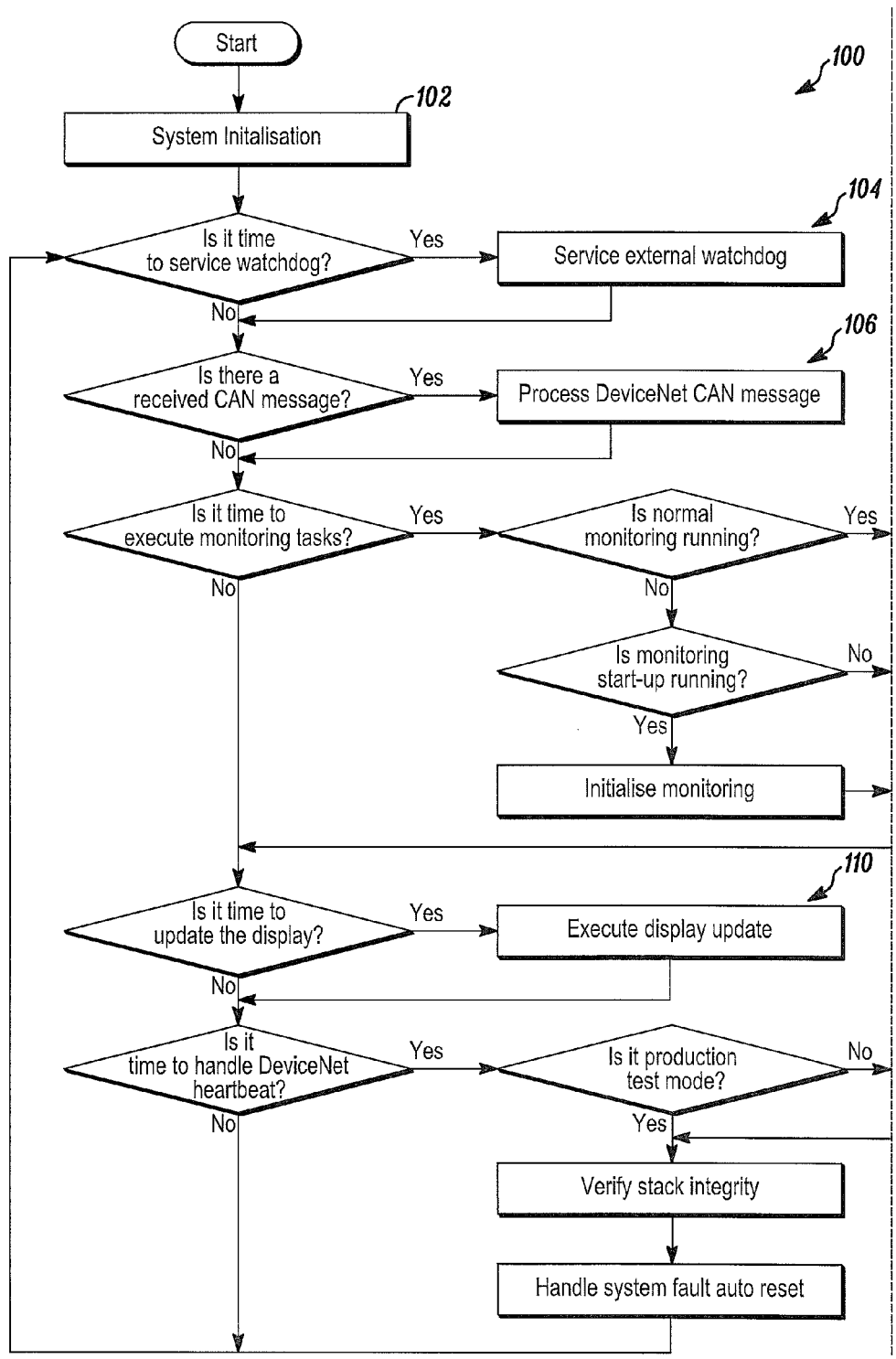
FIG. 3 illustrates a main control loop flow diagram.
Figure 3:
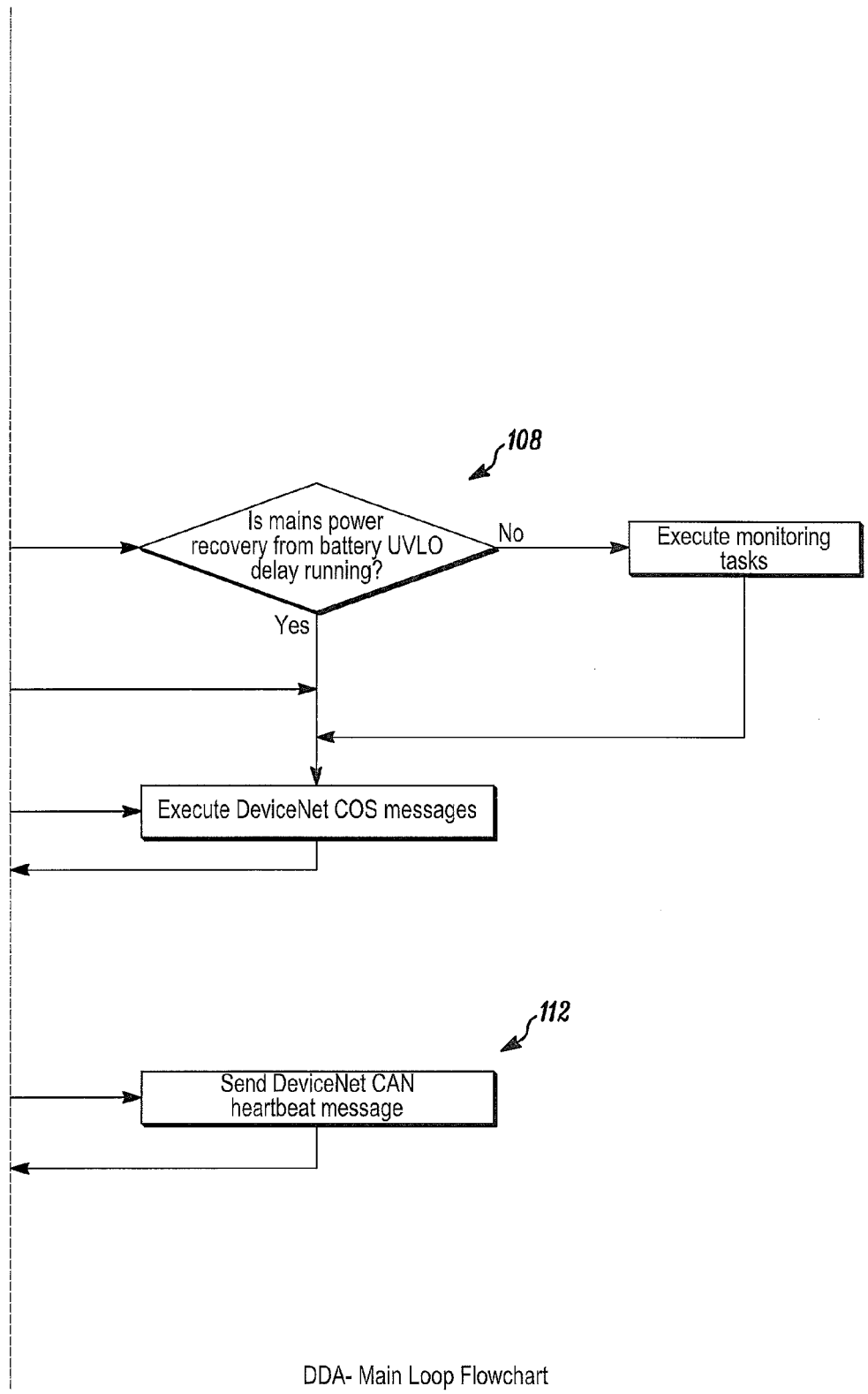

FIG. 3 illustrates a flow diagram of main loop system processing 100. After initialization as at 102, the main loop is entered. Watchdog processing, on a main loop basis, takes place, as at 104. CAN message processing takes place as at 106. Monitoring tasks are executed as at 108. The display is updated as at 110, and, heartbeat processing takes place as at 112.

Figure 3A:
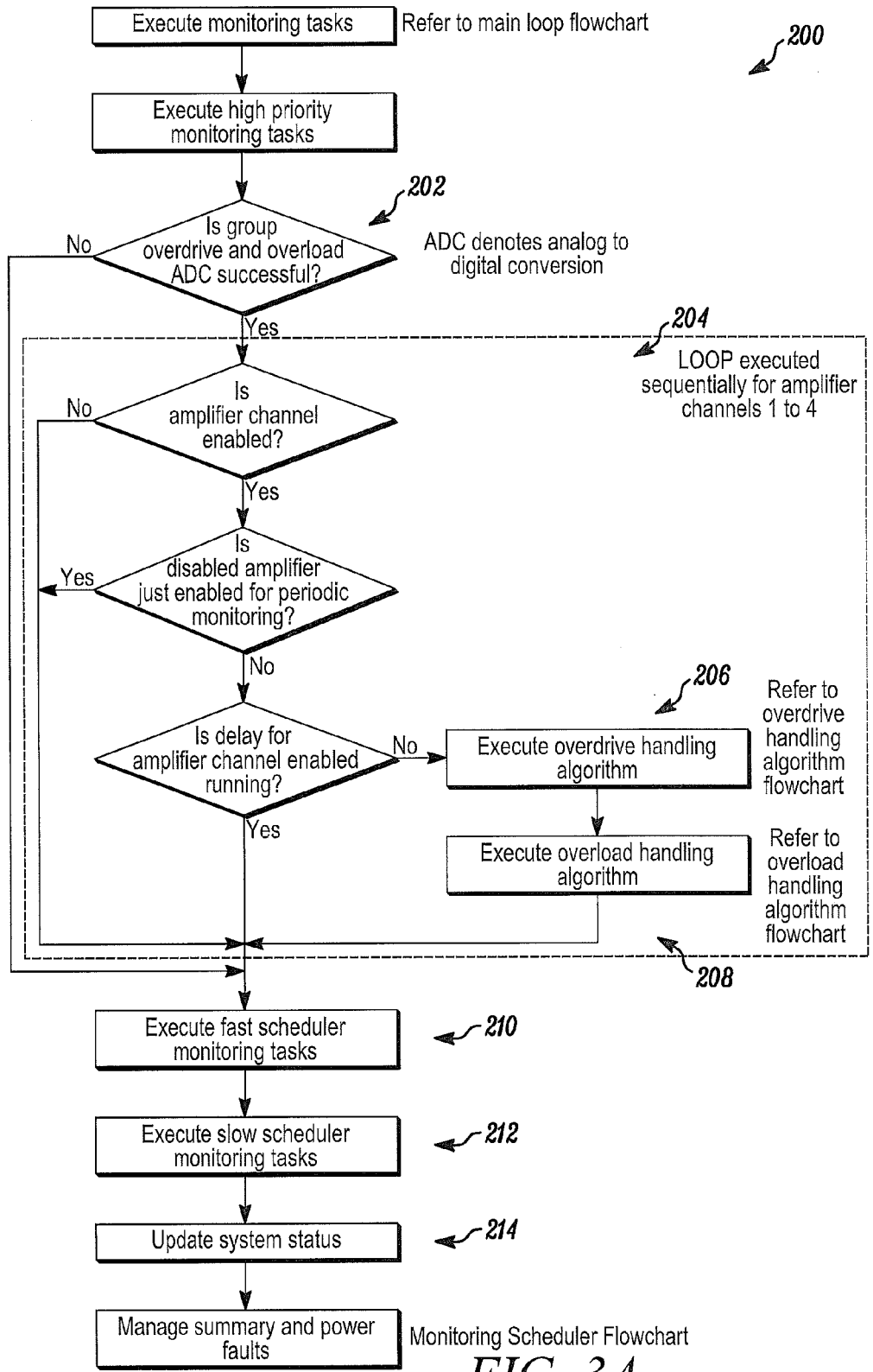
FIG. 3A illustrates a monitoring scheduler flow diagram.

FIG. 3A illustrates a flow diagram of monitoring scheduler 200. It details execution of monitoring tasks referenced at 108 in FIG. 3. ADC of overdrive and overload signals for all amplifier channels is executed as at 202. Sequentially for all amplifier channels as at 204 an overdrive handling algorithm takes place as at 206 followed by an overload handling algorithm as at 208. Fast monitoring tasks are executed as at 210 followed by execution of slow monitoring tasks as at 212. The system status is updated with the results as at 214.

Figure 4:
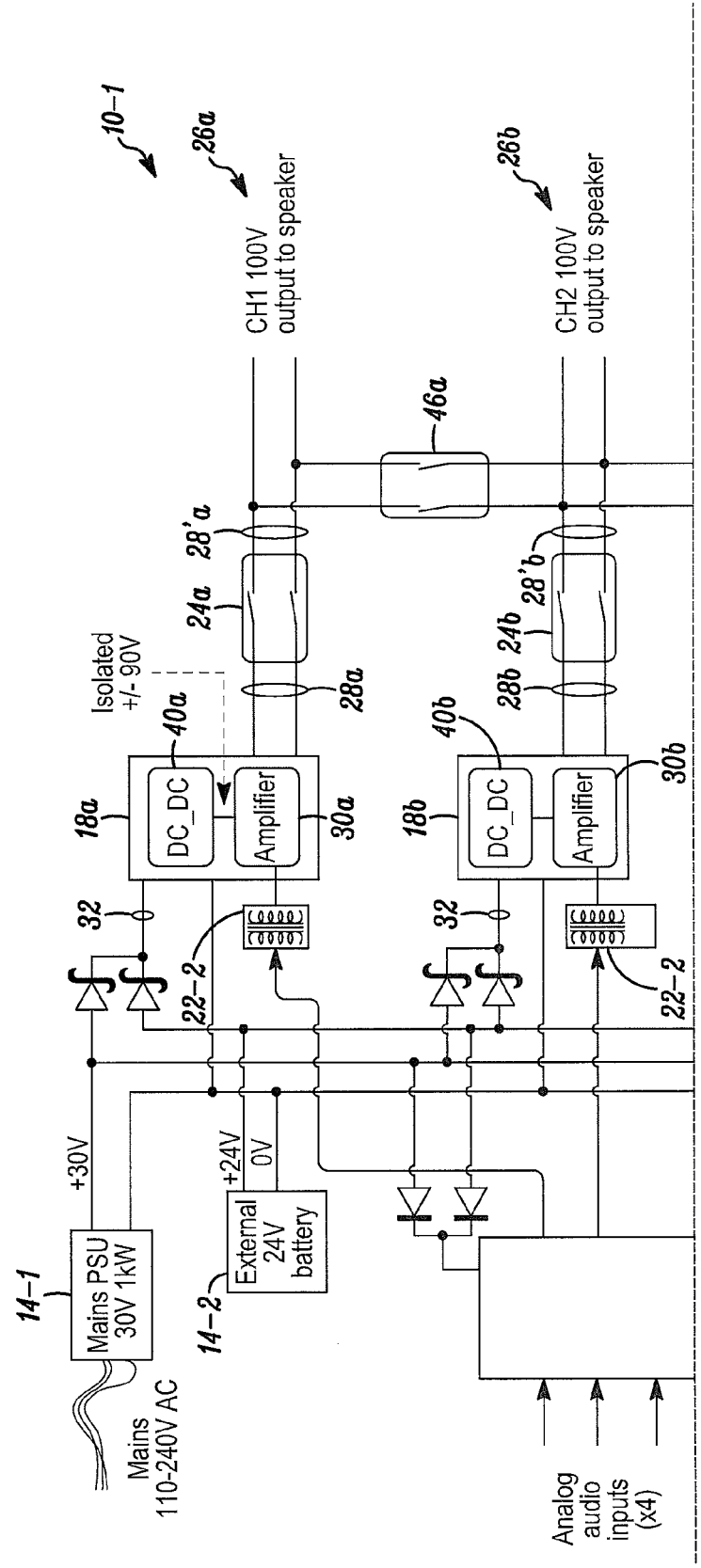
FIG. 4 illustrates a block diagram of a second embodiment of an amplifier.
Figure 4:
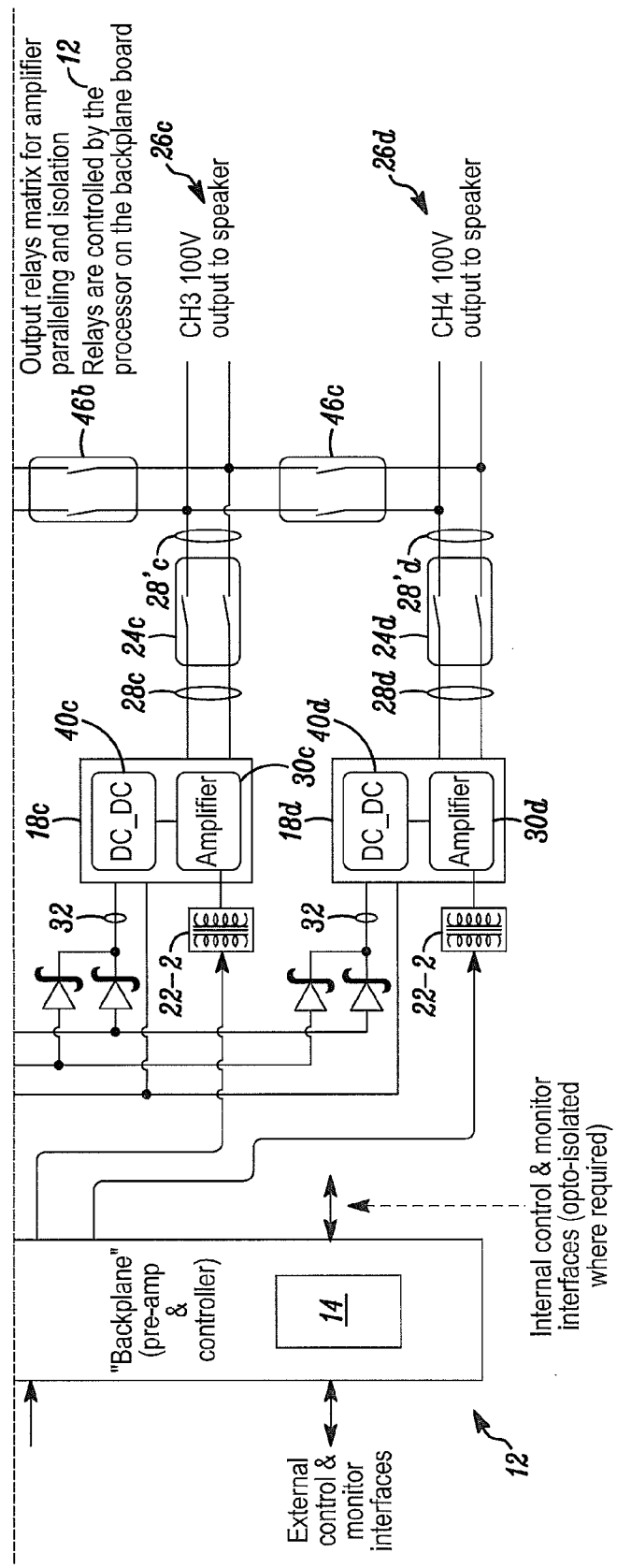

FIG. 4 illustrates another embodiment 10-1 hereof. Elements common to those in FIG. 1 have been assigned the same identification numeral and need not be discussed further.

Amplifier 10-1 includes two sets of relays, 24 *a, b, c, d* which will isolate the respective amplifier from the respective speaker 26 *a, b, c, d*. Additionally amplifier 10-1 includes a second set of relays 46 *a, b, c*. Members of the second set of relays can controllably combine pairs of output channels, from respective amplifiers such as 30 *a, b*, or 30 *b, c*, or 30 *c, d* to increase output to the respective speakers as needed.

The two sets of relays operate under the control of a common, programmable processor 14. It will also be understood that solid state switches could be used in place of relays without departing from the spirit and scope hereof.

Figure 4A:
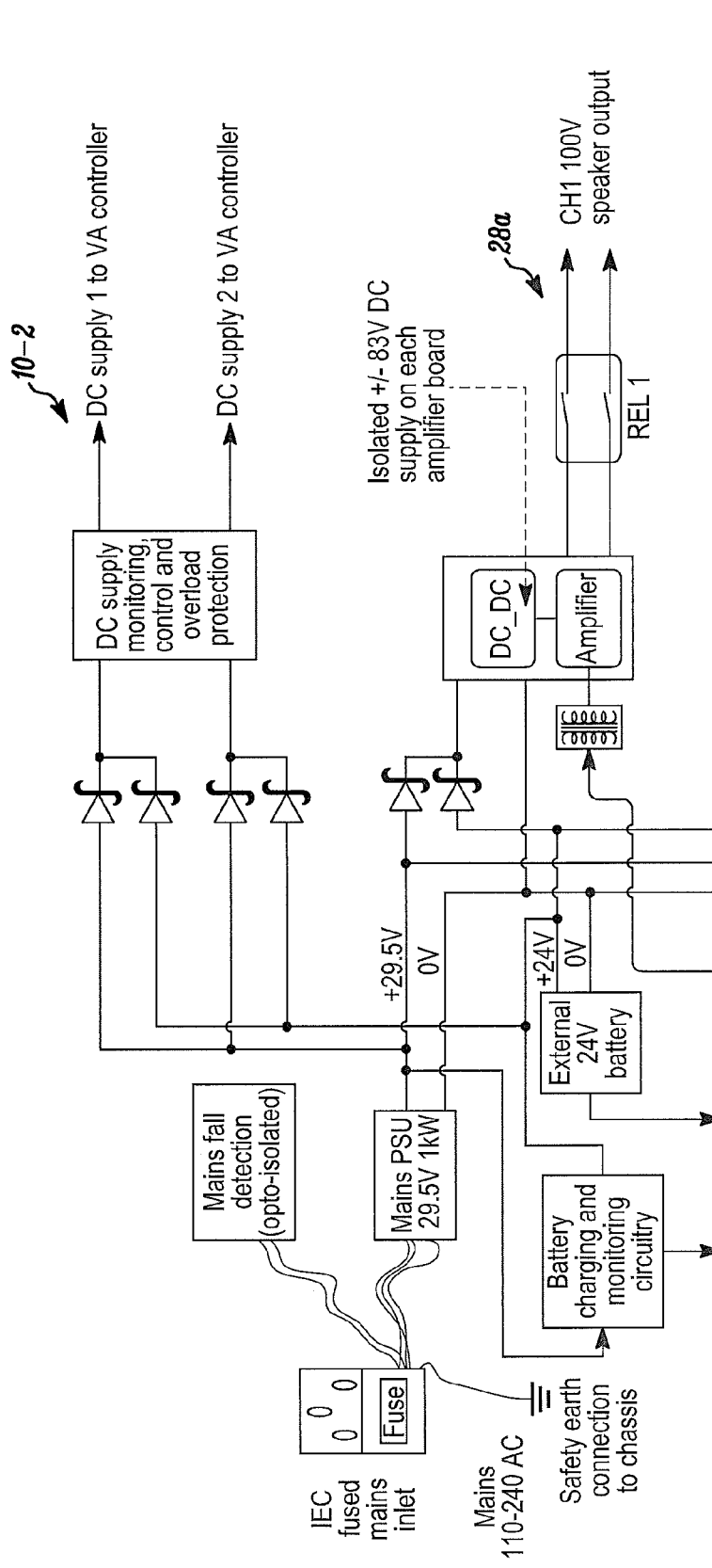
FIG. 4A illustrates a block diagram of a third embodiment of an amplifier.
Figure 4A:
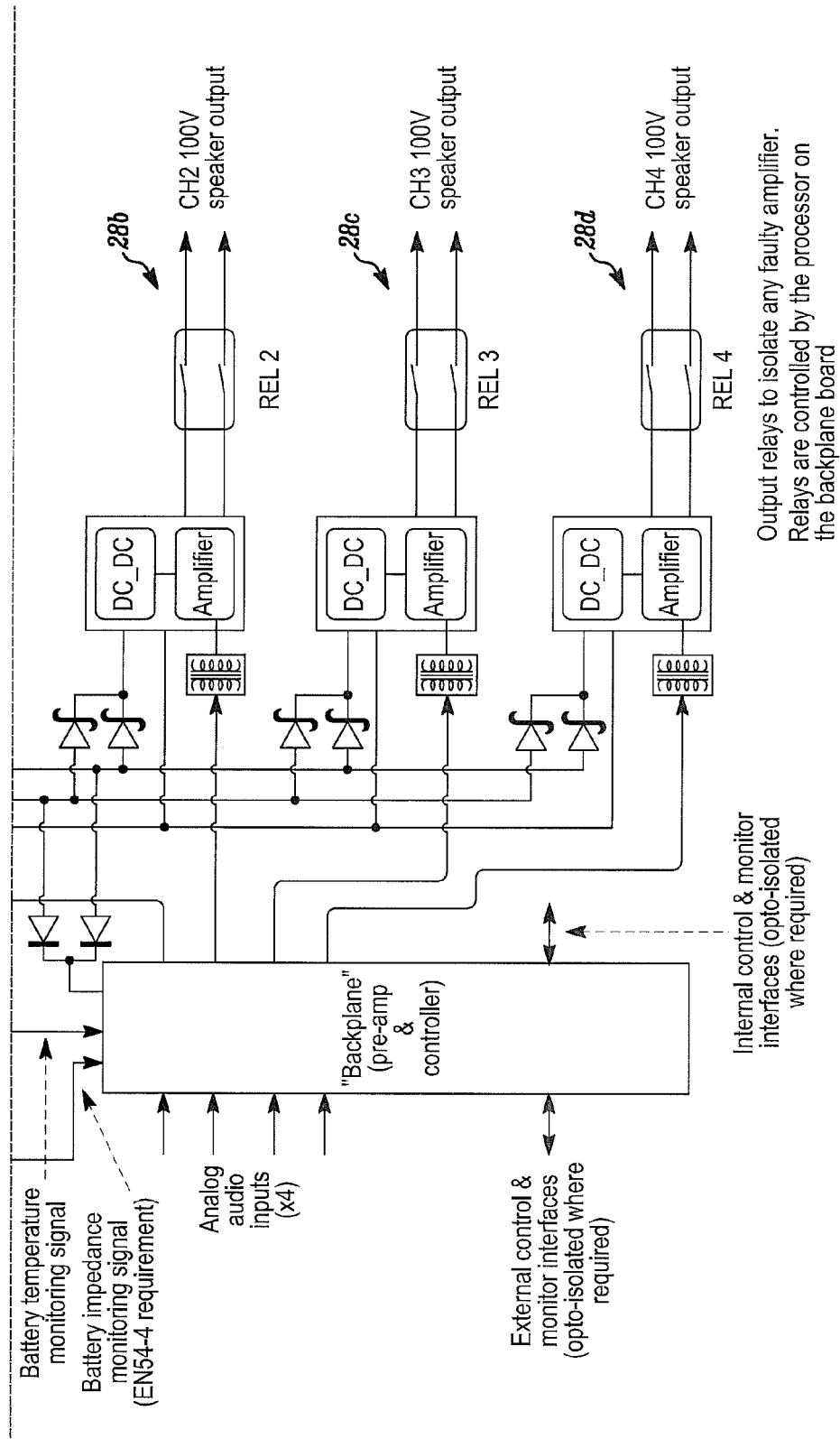

FIG. 4A illustrates another embodiment 10-2 hereof. Elements common to those in FIG. 4 have been assigned the same identification numeral and need not be discussed further.

Amplifier 10-2 uses an external cable connected to speaker outputs 28 *a, b, c, d* to connect amplifier channels in parallel for two-channel operation. In comparison to amplifier 10-1 shown on FIG. 4, relays 46 *a, b, c* are not utilized.

Figure 4B:
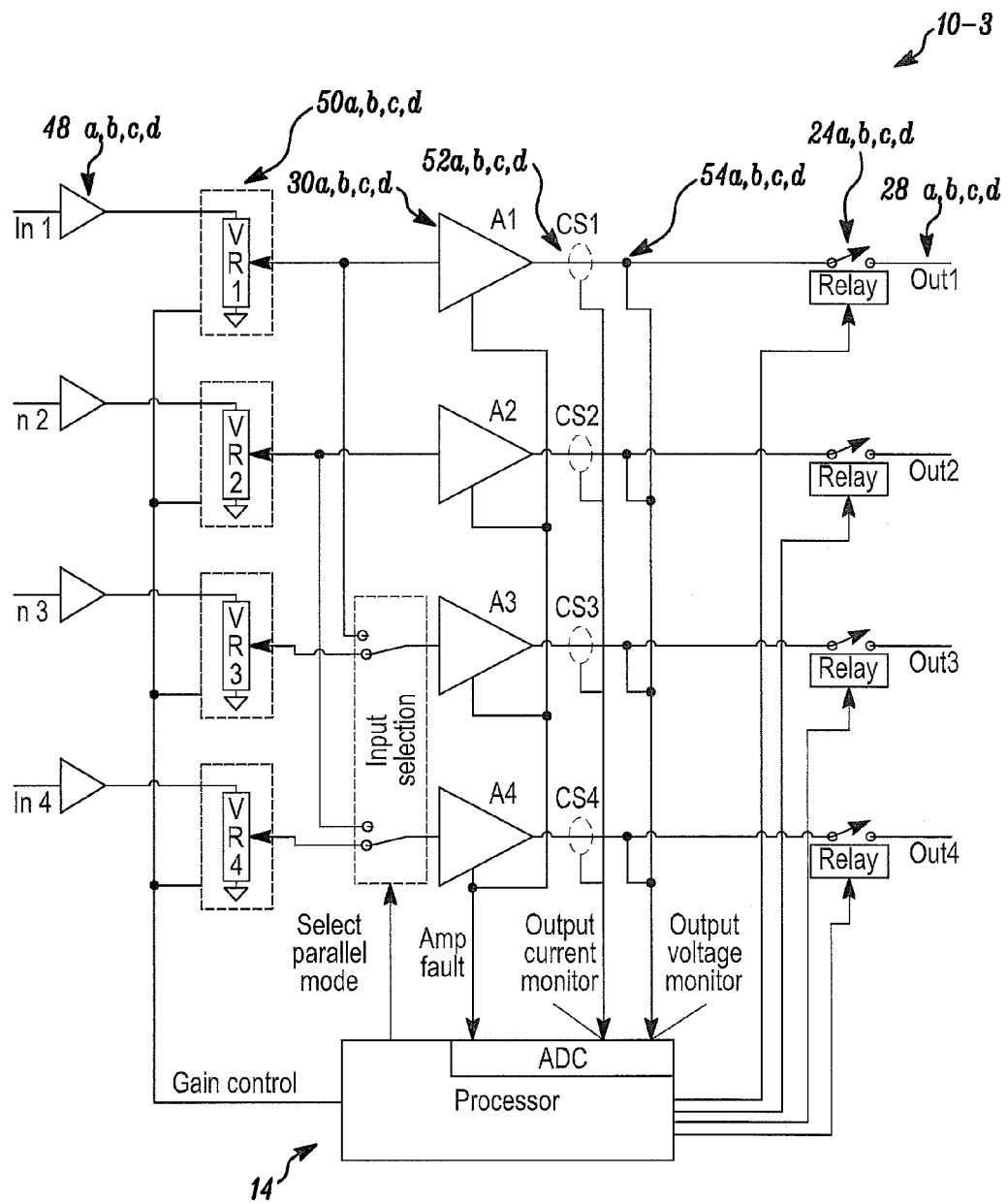
FIG. 4B illustrates a block diagram of a fourth embodiment of an amplifier.

FIG. 4B illustrates another embodiment 10-3 hereof. Elements common to those in FIG. 4 and FIG. 4A have been assigned the same identification numeral and need not be discussed further.

FIG. 4B shows the audio routing for normal (separate) and for parallel channel operation, together with the functional blocks enabling the high-integrity mode of operation. For simplicity, the diagram shows the audio path as an unbalanced signal. The mode of operation is equally applicable to a fully-balanced signal path. Each audio input signal is routed through an input buffer 48 *a, b, c, d*, then to a processor 14 controlled variable-level stage 50 *a, b, c, d*. Although the level control stages are shown as digitally controlled potentiometers, other linear or digital gain control stages are equally applicable.

In this particular implementation, inputs 48 *a, b* are directly routed to amplifier modules 30 *a, b*. Inputs 48 *c, d* are routed via an input selection function so that the correct input is routed to the correct amplifier module for four-channel normal operation or for two-channel parallel operation. In this way, only inputs 48 *a, b* together with the gain controls 50 *a, b* are used in the 2-channel parallel mode of operation. In the normal individual channel mode, the signal to each amplifier module has its own gain control. Other modes of operation could be used, such as for one input only to be routed to all four amplifier channels to enable a four-channel parallel mode having four times the output power of a single amplifier module. The mode of operation described for the two-channel parallel operation is equally applicable for an amplifier capable of operating with a larger number of channels working in parallel.

The output current from each amplifier module is measured by a linear current sensor 52 *a, b, c, d* providing input signals to an ADC to allow the processor 14 to measure the load current demanded from each of the amplifier channels. This current measurement may be implemented in different ways, such as by the use of a Hall-effect sensor, by a low-value sense resistor together with an instrumentation amplifier, or by a current transformer. As well as the real-time AC output current measurement, further ADC channels measure the AC output voltage 54 *a, b, c, d* of each amplifier channel. In this way, the effective load on the amplifier may be determined.

If the load exceeds the driving capability of the amplifier channel the signal level may be lowered using the input level control stages 50 *a, b, c, d* under the control of the processor 14, allowing the signal level control to have a number of different software-controlled modes of operation, including fully adaptive ones. By these means, it is possible for the amplifier to operate at a maximum undistorted output level, even if the effective load on the amplifier has been increased due to water or fire damage to the loudspeaker cabling. Essential life-safety messages may then still be able to be sent to the remaining loudspeakers, although at a lower than normal power level, when a conventional amplifier would have shut down due to the excessive load, or would be operating with unintelligible amounts of distortion.

The mechanism described hereof allows further enhanced operation when the amplifier 10-3 is operating in the parallel channel mode. In this mode, for the example shown in FIG. 4B, the speaker output 28 *a* is externally paralleled with speaker output 28 *c* using a suitable output cable. Likewise the speaker outputs 28 *b* and 28 *d* are paralleled. In normal operation all of the relays are closed. The output voltage and current from each individual amplifier module is still being monitored by the processor 14, allowing the same automatic control of output level to suit the load presented to the amplifier as for the normal non-parallel mode of operation.

In the event of a fault in one of the amplifier modules 30 *a, b, c, d* the processor 14 is able to determine the faulty module in the following way. (1) The input audio is muted by 50 *a, b, c, d* and all of the relays 24 *a, b, c, d* are opened, disconnecting the faulty amplifier, both from the load, and from its parallel partner. With the amplifiers isolated in this manner, the faulty module may be determined. (2) The faulty amplifier module is then powered down to avoid overloading the power supply and to prevent any over-temperature hazard. (3) The relays of the operational channels are then closed and the audio input signal is increased in a controlled manner to the original level, restoring the signal to all speakers. (4) In the event that the loading on a single channel now demands more power than it can provide, the same processor-controlled automatic gain mechanism as described earlier comes into play, so that the signal level is reduced only when absolutely necessary in an adaptive manner, to within the drive capability of the single driving channel, allowing minimal disruption to the voice-alarm messages.

It can be seen that the mechanism described above may be further enhanced in the case of an amplifier using more than two channels in parallel so that a high degree of redundancy in a single amplifier unit may be obtained.

Figure 5A:
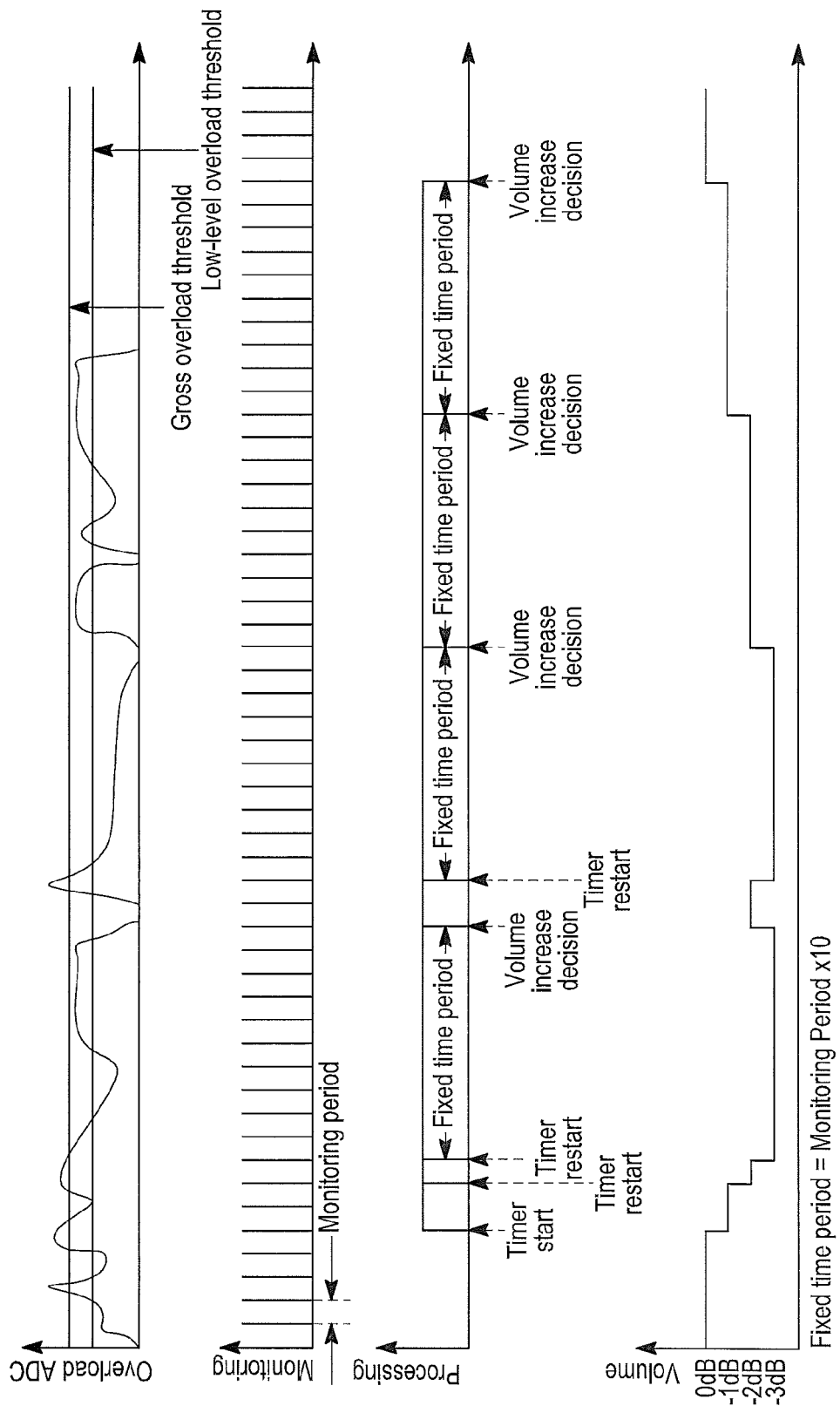
FIG. 5A illustrates graphs of overload processing.

Overload processing is illustrated in FIG. 5A. Dynamic automatic gain control (AGC) based on output loading can be incorporated as discussed above into any amplifier 10, 10-1, 10-2 or 10-3. The per channel output load current of each amplifier speaker output 28 *a, b, c, d*, is independently monitored in real time by processor 14. If the output load current increases to an extent that would put the respective amplifier channel into a current limiting condition, the output level is automatically reduced in pre-defined steps very quickly, for example every few milliseconds, to ensure that the audio remains undistorted. The output level is only reduced to the extent of preventing the output current from exhibiting an overload condition. As soon as the output load current returns to a normal range the output level is automatically restored to the normal value.

The dynamic AGC summarized above, enables a very high integrity parallel channel mode of operation. In this mode, pairs of output channels are connected in parallel to provide higher power operation, with internal routing of the input signals to the correct amplifier pairs. The method of automatically reacting, by amplifier isolation, if one of the amplifiers in a paralleled pair develops a fault enables the functioning channel of the pair to continue to emit the emergency message(s).

Figure 5B:
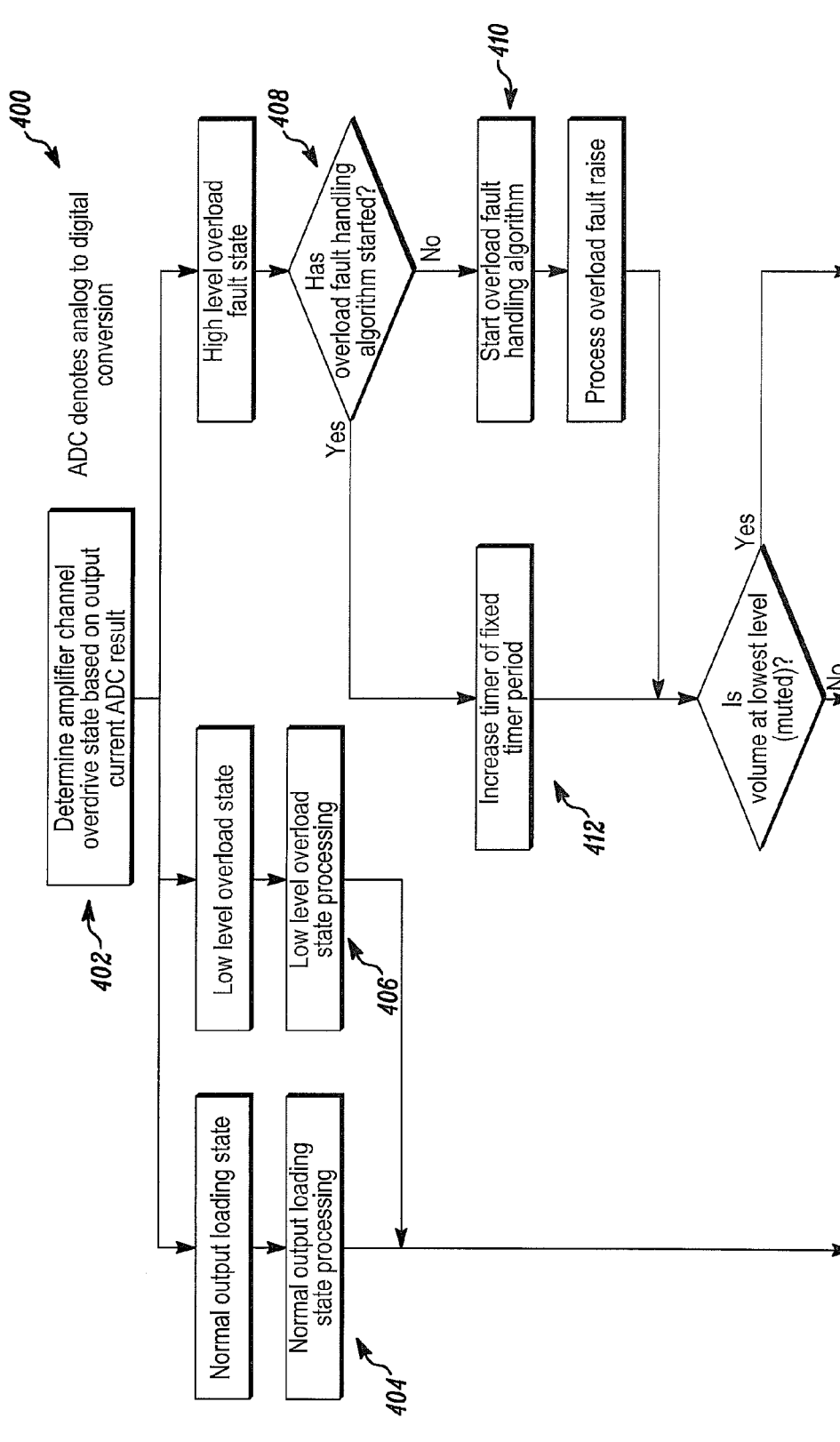
FIG. 5B illustrates a flow diagram of the processing of FIG. 5A.
Figure 5B:
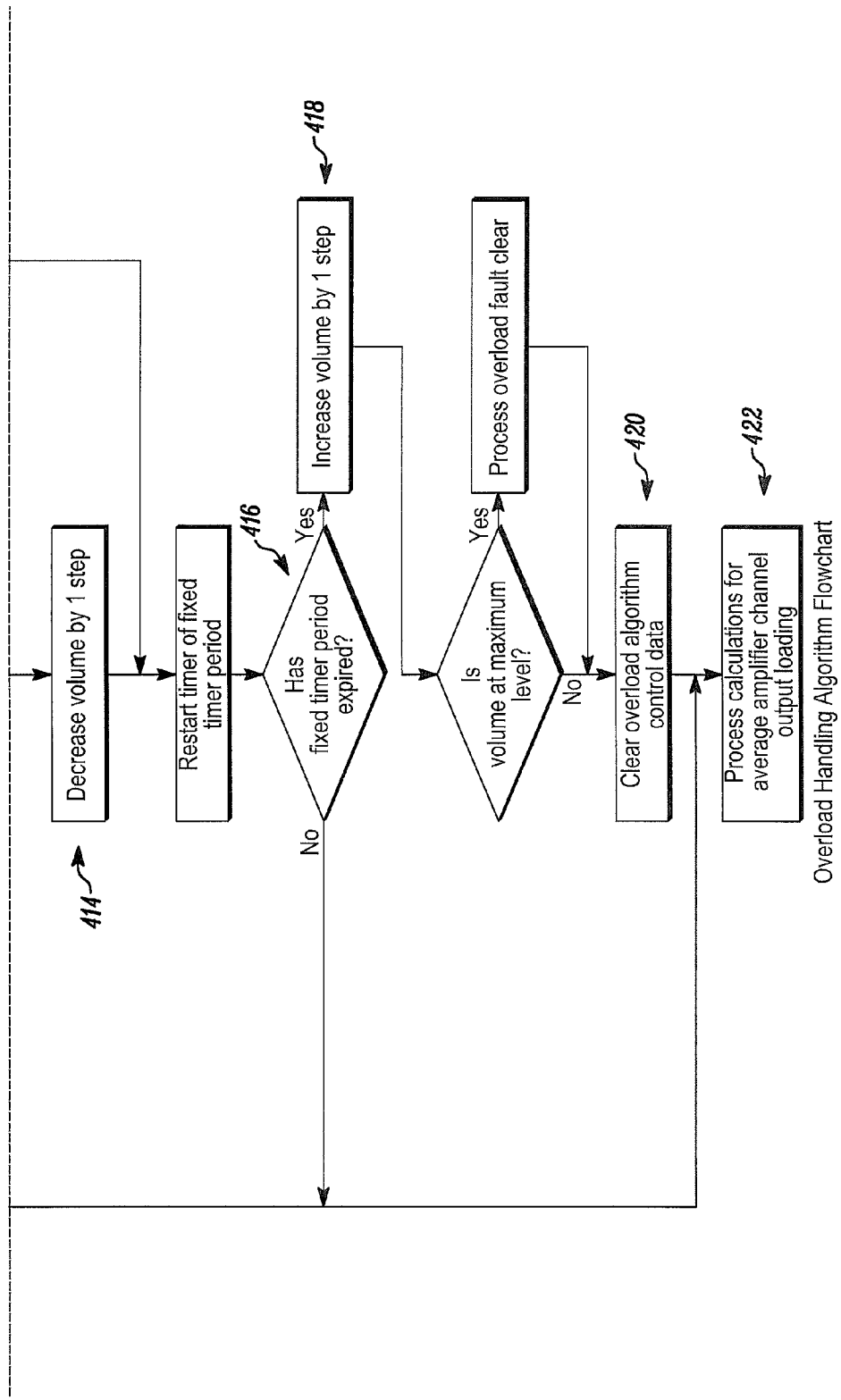

FIG. 5B illustrates a flow diagram of overload processing 400. It details execution of the overload handling algorithm referenced at 208 in FIG. 3A. An amplifier channel overload state is determined as at 402 based on an ADC result. The normal overload state is processed as at 404. The low level overload state is processed as at 406. An evaluation of whether the algorithm has started takes place as at 408 and respective processing is executed as at 410 and 412. If the volume is not muted, it is decreased by 1 step as at 414. An evaluation of whether the fixed timer period has expired takes place as at 416. In case it has expired, the volume is increased by 1 step as at 418. The overload handling algorithm control data is cleared as at 420 and average output loading calculations are executed as at 422.

Figure 6A:
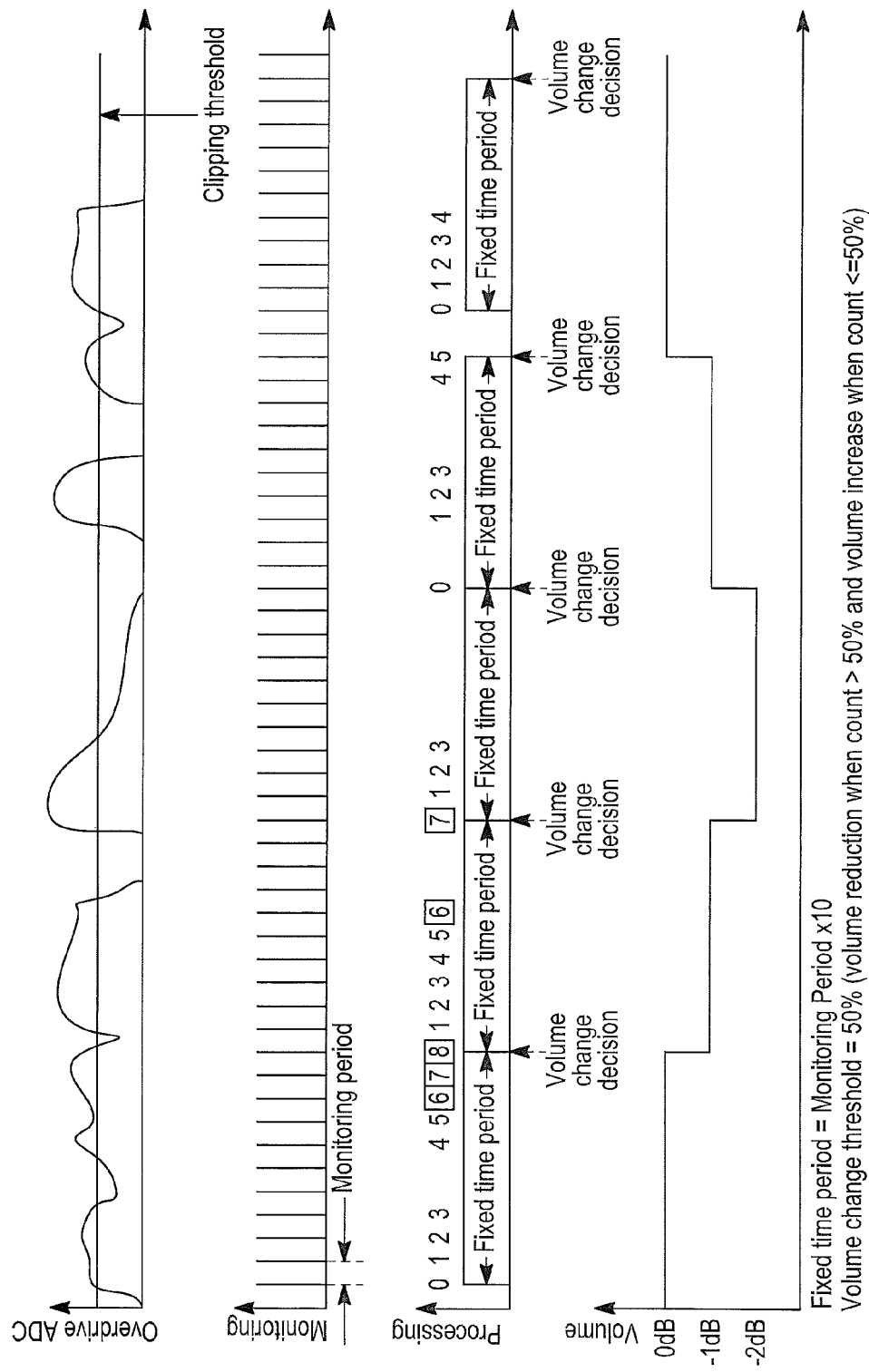
FIG. 6A illustrates graphs of overdrive processing.

Overdrive processing is illustrated in FIG. 6A. Dynamic automatic gain control (AGC) based on output level can be incorporated into any amplifier 10, 10-1, 10-2 or 10-3. The per channel output voltage of each amplifier speaker output 28 *a, b, c, d*, is independently monitored in real time by processor 14. If the output voltage increases to an extent that would put the respective amplifier channel into a clipping condition, the output level is automatically reduced in steps very quickly, for example in tens of milliseconds, to ensure that the audio remains undistorted. The output level is only reduced to the extent of preventing the output voltage from exhibiting a clipping condition. As soon as the output voltage returns to a normal range the output level is automatically restored to the normal value.

Figure 6B:
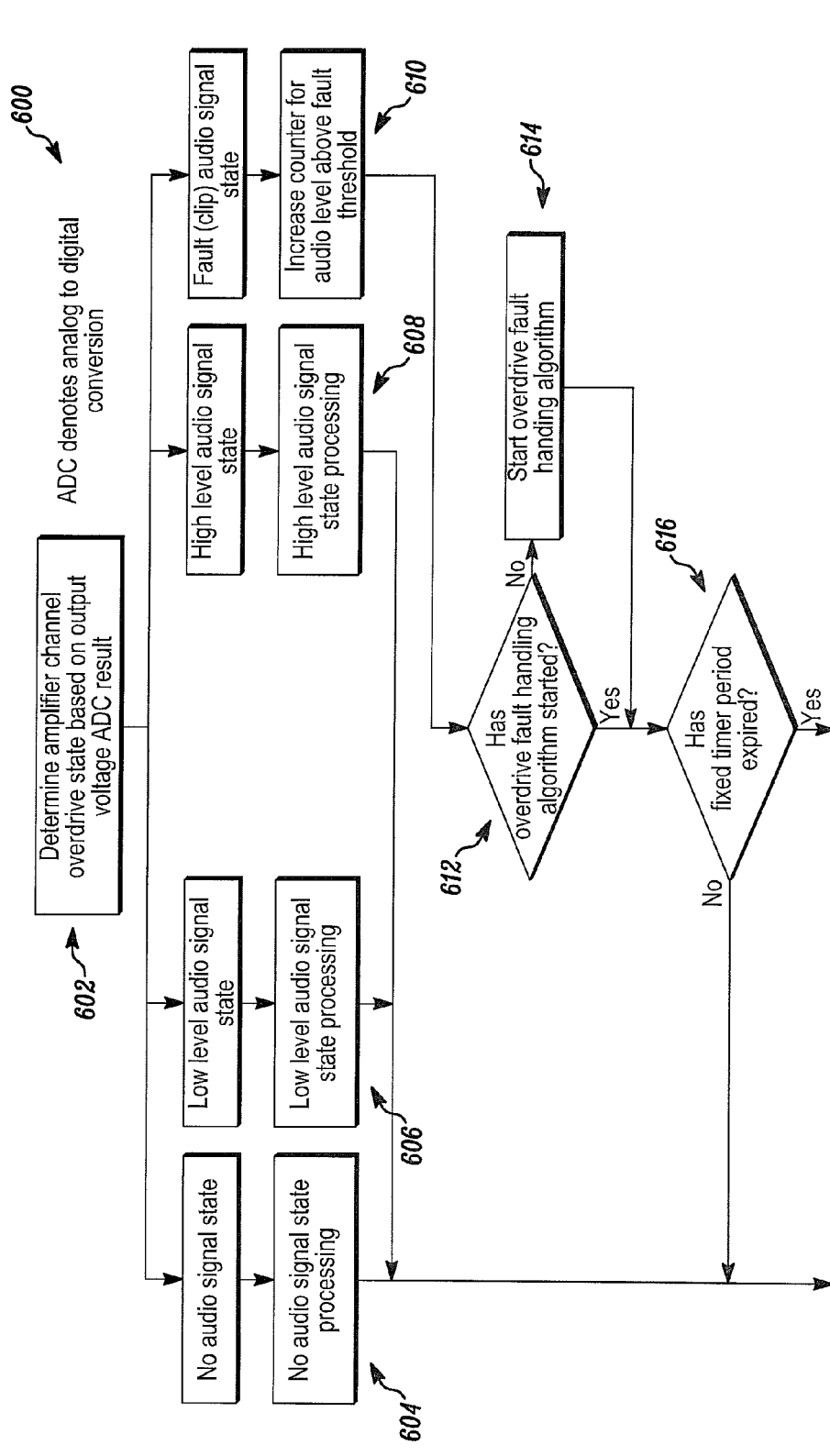
FIG. 6B illustrates a flow diagram of the processing of FIG. 6A.
Figure 6B:
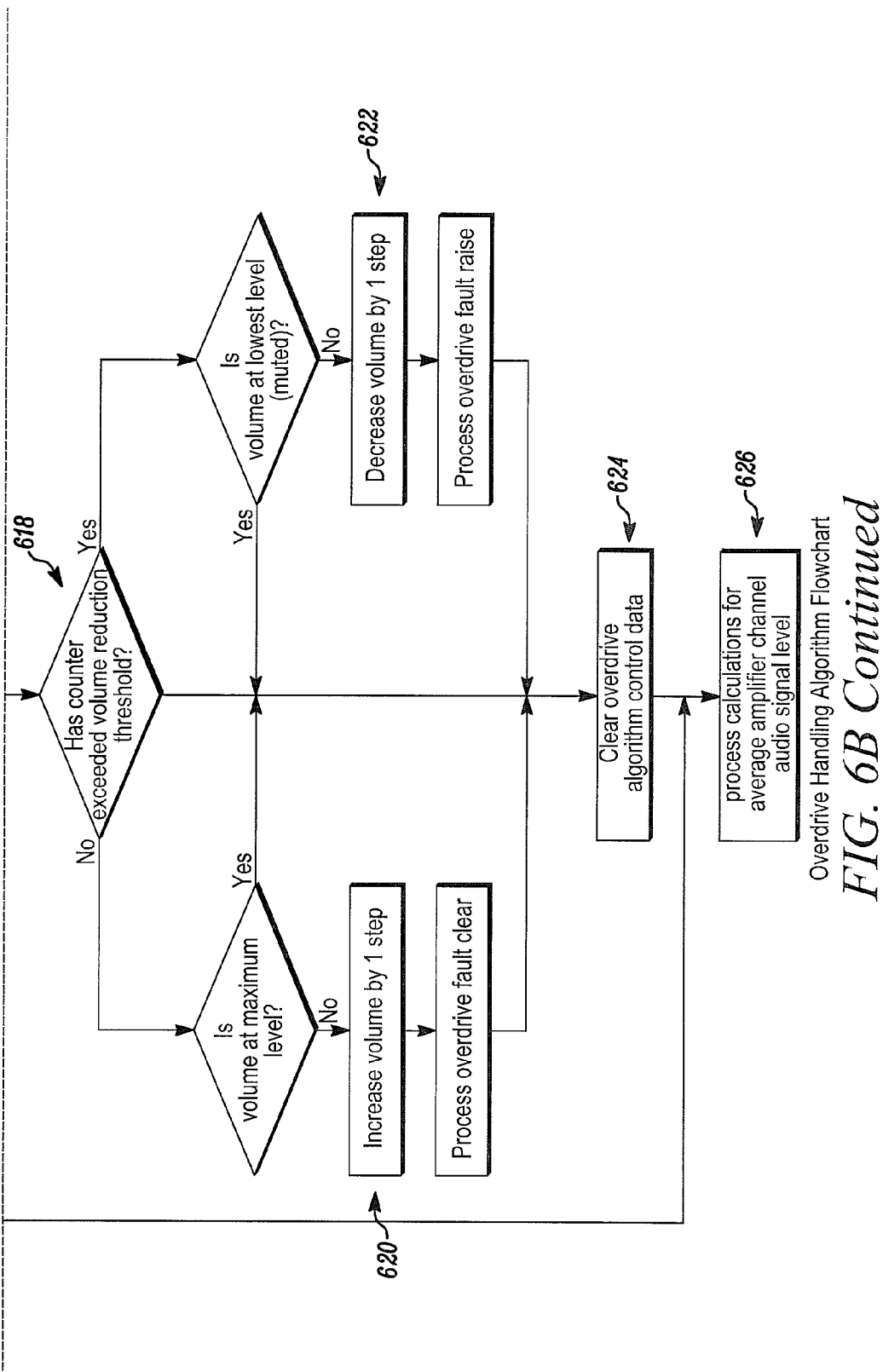

FIG. 6B illustrates a flow diagram of overdrive processing 600. It details execution of the overdrive handling algorithm referenced at 206 in FIG. 3A. An amplifier channel overdrive state is determined as at 602 based on ADC result. The normal overdrive state is processed as at 604. The low level overload state is processed as at 606. The high level overdrive state is processed as at 608. The clip fault overdrive state is processed as at 610 where a counter is increased. An evaluation of whether the algorithm has started takes place as at 612 and respective processing is executed as at 614. An evaluation of whether the fixed timer period has expired takes place as at 616. In case it has expired, an evaluation of whether the counter has exceeded a defined threshold takes place at 618. In case the counter has exceeded the threshold, the volume is decreased by 1 step as at 622, otherwise the volume is increased by 1 step as at 620. The overdrive handling algorithm control data is cleared as at 624 and average audio signal calculations are executed as at 626.

Both overload and overdrive algorithms described respectively in FIG. 5A/B and FIG. 6A/B are executed independently. Additionally, the algorithms operate independently on a per channel basis to ensure a high level of integrity.

With reference to FIG. 4 and amplifier 10-1, the outputs, such as 28 a, b, c, d, of each amplifier pass through the contacts of a respective relay, such as 24 a, b, c, d. In normal operation these relay contacts are closed, connecting the amplifier to the load, speaker 26 a, b, c, d. In the parallel-connected mode, implemented using relays 46 a, b, c, as in the normal independent channel mode, each of the individual amplifiers in the parallel pair has its output current monitored in real time. In the event of excess current flow from one of the amplifiers, or in the event that one of them indicates a fault condition, the relays are opened, isolating both amplifiers from the load. The faulty amplifier then has its power turned off, and the relay for the good, non-faulting, amplifier is turned back on.

This all happens very quickly. The single amplifier now attempts to power the load at the original volume level. It is quite possible that the single channel may not now be able to provide an adequate output current to power the load that had originally been powered by the paralleled pair of amplifiers. In this case the real-time output current monitor signal is used as part of the AGC system described above, to lower the output level just enough to ensure that the amplifier can now drive the load. This process ensures that the output level is not reduced by more than absolutely necessary.

From the foregoing, it will be observed that numerous variations and modifications may be effected without departing from the spirit and scope hereof. It is to be understood that no limitation with respect to the specific apparatus illustrated herein is intended or should be inferred. It is, of course, intended to cover by the appended claims all such modifications as fall within the scope of the claims. Further, logic flows depicted in the figures do not require the particular order shown, or sequential order, to achieve desirable results. Other steps may be provided, or steps may be eliminated, from the described flows, and other components may be added to, or removed from the described embodiments.

The invention claimed is:

1. An amplifier comprising:
a plurality of independent audio output channels, each channel in the plurality includes a local, isolated, power supply and a channel power amplifier;
switching elements which, in response to separate control signals, couple together outputs from different channel power amplifiers; and
automatic gain control circuitry implemented independently on a per-channel basis.

2. An amplifier as in claim 1 which includes independent per-channel fault monitoring circuitry.

3. An amplifier as in claim 1 where each power amplifier drives a respective output transducer via a transformerless coupling.

4. An amplifier as in claim 1 which includes fault responsive elements to separate the outputs of the coupled different channel power amplifiers, wherein a functioning amplifier continues to emit audible outputs.

5. An amplifier as in claim 4 which includes monitoring circuitry to adjust an output level of the functioning amplifier in accordance with an existing load.

6. An amplifier as in claim 1 where the local power supplies each include at least one isolated DC-DC converter.

7. An amplifier as in claim 6 where the power amplifiers each include input isolation circuitry for an audio signal.

8. An amplifier as in claim 7 where the power amplifiers each comprise Class D power amplification amplifiers.

9. An audio output amplifier comprising:
a common control element; and
a plurality of audio output channels,
wherein each audio output channel in the plurality includes an isolated power supply and an amplifier,
wherein members of the plurality are releasably coupled to the control element, and
wherein the control element carries out, on a per-channel basis, dynamic automatic gain control based on output loading.

10. An amplifier as in claim 9 wherein an output from each audio output channel in the plurality includes an isolation switching element to isolate a respective output transducer from a respective faulty channel.

11. An amplifier as in claim 9 wherein pairs of audio channel inputs and outputs are coupled together to provide increased power output levels by activation of selected switching elements.

12. An amplifier as in claim 11 wherein each amplifier includes switching circuits for decoupling a respective channel from a respective output transducer and other switching circuits for coupling at least two channel outputs together to drive a common load.

13. An amplifier as in claim 9 wherein each amplifier includes a gain controlled pre-amplifier coupled to an isolated audio power amplifier.

14. An amplifier as in claim 13 wherein each amplifier is transformerlessly coupled to an output transducer.

15. An amplifier as in claim 9 wherein the control element carries out, on a per-channel basis, parallel channel operation responsive to fault conditions to automatically revert from parallel channel operation to single channel operation with a faulty amplifier automatically isolated.

16. A method of operating an amplifier comprising:
providing a plurality of audio output channels wherein each audio output channel in the plurality includes an isolated power supply and an amplifier;
operating each of the audio output channels in the plurality independently;
sensing a fault in one of the plurality of audio output channels, and responsive thereto, carrying out automatic gain control based on output loading.

17. A method as in claim 16 wherein carrying out automatic gain control includes:

monitoring load current for the amplifier in the one of the plurality of audio output channels;

comparing the load current to a predetermined threshold; and responsive to results of the comparing, iteratively reducing an output power level of the amplifier in the one of the plurality of audio output channels a predetermined amount and again comparing the load current to the predetermined threshold until the load current falls below the predetermined threshold, and, ceasing the iterative reducing and comparing once the load current has returned to a predetermined normal level increasing the output power level.

18. A method as in claim 16 further comprising:

operating at least a first channel and a second channel of the plurality of audio output channels in parallel; and sensing a fault in either the first channel or the second channel, and responsive thereto, isolating the faulty channel.

* * * * *